United States Patent [19]

Nagayama

[11] Patent Number: 5,814,417
[45] Date of Patent: Sep. 29, 1998

[54] ORGANIC ELECTROLUMINESCENT ELEMENT

[75] Inventor: Kenichi Nagayama, Tsurugashima, Japan

[73] Assignee: Pioneer Electronic Corporation, Tokyo, Japan

[21] Appl. No.: 689,127

[22] Filed: Jul. 30, 1996

[30] Foreign Application Priority Data

Aug. 8, 1995 [JP] Japan .................................... 7-222514

[51] Int. Cl.⁶ ....................................................... B32B 9/02
[52] U.S. Cl. ......................... 428/690; 313/504; 313/506; 313/509; 313/511; 428/917
[58] Field of Search .................................... 428/690, 917; 313/504, 506, 509, 511

[56] References Cited

U.S. PATENT DOCUMENTS 4,909,895  3/1990  Cusano ..................................... 156/643
5,332,946  7/1994  Eckersley et al. ....................... 313/506

FOREIGN PATENT DOCUMENTS 2 063 544  6/1981  United Kingdom .

OTHER PUBLICATIONS

Patent Abstracts of Japan, vol. 017, No. 257 (E–1368), May 20, 1993 & JP 05 003077 A (Pioneer Electron Corp), Jan. 8, 1993, *Abstract.

Patent Abstracts of Japan, vol. 017, No. 257 (E–1368), May 20, 1994 & JP 05 003076 A (Pioneer Electron Corp), Jan. 8, 1993, *Abstract.

*Primary Examiner*—John M. Cooney, Jr.
*Attorney, Agent, or Firm*—Sughrue, Mion, Zinn, Macpeak & Seas, PLLC

[57] ABSTRACT

An organic electroluminescent element comprises; a transparent substrate; an anode formed on the substrate; an emitting functional layer made of an organic material formed on the anode; and a cathode disposed on the emitting functional layer with a predetermined shape to be formed by a laser-material-processing; characterized in that a laser protective layer of a heat-resistant thin film is disposed on at least a portion to be provided with the laser-material-processing between the emitting functional layer and the anode; and alternatively or additionally in that a laser absorbing layer of a thin film with a predetermined thickness having a reflectance lower than that of the cathode with respect to a predetermined wavelength of the laser beam is formed on the cathode at a portion to be provided with the laser-material-processing.

8 Claims, 5 Drawing Sheets

EMISSION

ORGANIC ELECTROLUMINESCENT ELEMENT

BACKGROUND OF THE INVENTION

1. Field of the Invention

The present invention relates to an organic electroluminescent element for constructing a display panel used in a display apparatus and, particularly, to a structure of the organic electroluminescent element facilitating a laser-material-processing of a cathode pattern thereof.

2. Description of the Related Art

There is known an organic electroluminescent element utilizing an electroluminescence phenomenon. The organic electroluminescent element is used for a pixel in the display panel used in the display apparatus for displaying characters, video images or the like. FIG. 4 shows a schematic cross-sectional view of one example of organic electroluminescent elements. The organic electroluminescent element is formed in such a manner that a transparent anode 102 is disposed on a transparent glass substrate 101. An emitting functional layer 103 is disposed on the anode 102 which is made of at least one thin film of an organic fluorescent and including an organic hole transport layer or the like, and in turn a metallic cathode 104 is vacuum-vapor-deposited on the emitting functional layer 103. The cathode 104 is patterned with a predetermined shape. A driving current source 105 is connected between the cathode 104 and the anode 102. The driving current source 105 supplies a suitable current to the organic electroluminescent element so as to allow it to emit light correspondingly to the supplied current to the emitting functional layer 103 in the form of the pattern shape of the cathode 104 and the anode 102 so that the emitted light passes through the transparent glass substrate 101 as a displayed pattern.

There are various patterning methods for forming the cathode pattern in the organic electroluminescent element.

In one of the patterning methods, after a metallic cathode film is entirely formed on the emitting functional layer, then a specific photoresist comprising a specific solvent for non-melting the organic EL medium of the emitting functional layer is formed on the metallic cathode film with a desirable cathode pattern. After that, the metallic cathode film is etched by a dilute sulfuric acid to form the desirable cathode pattern in the photolithography patterning.

In another of the patterning methods, straight higher walls with a height of several or tens micrometers as masks are previously formed parallel to each other on the substrate with anodes in the form of a stripe. After that, the organic EL medium thin films and the cathodes are vacuum-deposited in turn by using such higher wall masks in such a manner that the EL medium or metallic vapor flow is provided in only one slanting direction to the substrate and partially and selectively shielded by the higher wall masks.

In yet another of the patterning methods, after a metallic cathode film is entirely formed on the emitting functional layer, then a portion of the metallic film other than a desirable cathode pattern is removed by a thermal irradiation such as a laser beam. In this case, the emitting functional layer under the cathode is partially left to avoid an electric short circuit between the cathode and the anode after the laser beam patterning.

As mentioned above, the organic electroluminescent element is formed by these patterning methods so as to pattern the desirable cathode pattern.

In recent years, there is a demand for the display apparatus using the organic electroluminescent element to be minimized in its pixels and precise shapes of emitting portions thereof in accordance with varieties of information and a high density on the recording medium. Therefore, it is necessary to process the cathode pattern at a high precision in the flexible display panel manufacture.

However, in the cathode patterning method above mentioned using the etching process by the dilute sulfuric acid, there is a probability of the element being damaged by water contained in the dilute sulfuric acid resulting in a deterioration in performance of the element.

In addition, there is also a problem in the cathode patterning method above mentioned using the higher wall stripes on the substrate. Such a method restricts the flexible layout of the pattern of pixels within the stripe shapes, since the wall masks must be formed perpendicular to the only one slanting direction of the organic EL medium vapor flow. Therefore, it is impossible to form a pixel pattern with a delta arrangement RGB in the panel nor any display panel with a bent or meandering cathode pattern.

Moreover, there is also a problem in the cathode patterning method above mentioned using the thermal processing of the laser beam although it avoids the deterioration due to water without restricting the cathode pattern. However, the cathode film is metallic lustrous and has a high reflectance in general since it is made of Al, Mg or the like or the alloy thereof. It is therefore necessary to irradiate a high powerful laser beam onto such a metallic lustrous cathode film sufficient to provide the thermal energy to the metallic film. Such a laser-material-processing using a high powerful laser beam has adverse influences upon the anode and the emitting functional layer made of an organic compound having a melting point lower than the cathode because of the thermal dispersal. As a result, as shown in FIG. 5A. The high power laser beam makes punctures of damaged portions 106 in the emitting functional layer 103 and the anode 102 under the cathode 104.

In addition, when the laser beam having an uneven intensity distribution is irradiated to the cathode film to be processed, a residual burr 107 is produced in the cathode film 104 as shown in FIG. 5B because the sublimation of the cathode film does not occur sufficiently at such a portion. Particularly, when both the damaged portions of the organic compound and the residual burr of the cathode occur at the same time in the thermal processing, then the anode and the cathode make an electric short circuit as shown in FIG. 5C so that such a portion no longer functions as a display element.

Therefore, the cathode patterning method above mentioned using the thermal processing of the laser beam is restricted in accuracy of the thermal processing for the cathode pattern. It is therefore difficult to manufacture the display panel having a plurality of organic electroluminescent elements having a flexible cathode shape with a high yield rate.

SUMMARY OF THE INVENTION

Therefore, the present invention has been made to solve such a problem in view of the forgoing status. An object of the invention is to provide an organic electroluminescent display panel and a method for manufacturing the same which are capable of being manufactured with a freely flexible patterning without deterioration of the organic function layer, cathode and other elements.

The present invention as set forth in claim 1 is directed to an organic electroluminescent element including:

a transparent substrate;

an anode formed on the substrate;

an emitting functional layer made of an organic material formed on the anode;

a cathode with a predetermined shape to be formed by a laser-material-processing; and a laser protective layer made of a heat-resistant thin film and disposed on at least a portion to be provided with the laser-material-processing between the emitting functional layer and the anode.

The present invention a set forth in claim 2 is directed to an organic electroluminescent element including:

a transparent substrate;

an anode formed on the substrate;

an emitting functional layer made of an organic material formed on the anode;

a cathode with a predetermined shape to be formed by a laser-material-processing; and a laser absorbing layer made of a thin film with a predetermined thickness having a reflectance lower than that of the cathode with respect to the predetermined wavelength of the laser beam and formed on the cathode at a portion to be provided with the laser-material-processing.

According to the present invention set forth in claim 1, the laser protective layer disposed between the emitting functional layer and the anode or the transparent substrate having a heat-resistant property prevents the thermal dispersion caused by the irradiated laser beam of the laser-material-processing, so that the portions to be provided with the laser-material-processing accumulate the heat energy at a high efficiency. Further, the laser protective layer interrupts the thermal dispersion under the portion to be provided with the laser-material-processing, so that no thermal damage occurs. Therefore, by using a high power laser beam a flexible cathode shape is easily processed without any damage to the element.

According to the present invention set forth in claim 2, since the laser absorbing layer is formed of a thin film with a predetermined thickness having the reflectance lower than that of the cathode on at least a portion to be provided with the laser-material-processing on the cathode, the laser-processed portion can accumulate the heat energy caused by the irradiated laser beam at a high efficiency so that the laser absorbing layer enables a low power laser to process the cathode shape without any residual burr. In addition, the laser absorbing layer restricts the thermal dispersal around the portion to be provided with the laser-material-processing so as to protect the anode and the emitting functional layer from the thermal damage.

Therefore, to sum up, the present invention ensures that a flexible cathode shape is easily processed without any residual burr so as to facilitate a laser-material-processing of a flexible cathode pattern of the organic electroluminescent element with a high yield rate of production.

The above set forth and other features of the invention are made more apparent in the ensuing Detailed Description of the Invention when read in conjunction with the attached Drawings.

DETAILED DESCRIPTION OF THE PREFERRED EMBODIMENTS

The first embodiment according to the present invention will be described in more detail with reference to FIGS. 1A–1E of the accompanying drawings. FIGS. 1A–1E are partially enlarged schematic cross-sectional views of an organic electroluminescent element of the present invention in which members formed on a substrate are laser-processed in turn in the manufacture of the organic electroluminescent element.

Figure 1A:
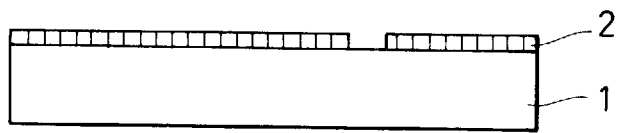
FIGS. 1A–1E are schematic cross-sectional views each showing a substrate of an organic electroluminescent element in the laser-processing of a first embodiment according to the present invention.

First, as shown in FIG. 1A, a transparent anode 2 is formed with a predetermined shape on a transparent glass substrate 1.

Figure 1B:
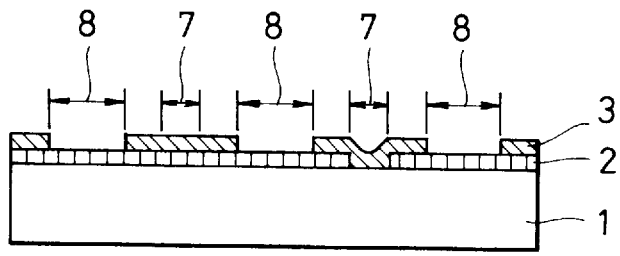

Next, as shown in FIG. 1B, an insulative material layer such as a photoresist is formed at a thickness of from 0.1 to tens micrometers on the glass substrate 1 or the anode 2 by the spin-coating method, the roll-coating method or the like. After that, the resultant glass substrate is pre-baked. Next, portions in the pixel region 8 are exposed correspondingly to the pixels of the organic electroluminescent element by using a VV ramp and a photo-mask and then the substrate 1 is developed and rinsed. After that, the resultant glass substrate is pot-baked. In this way, the laser protective layers 3 are formed on the glass substrate 1 or the anode 2. Since this laser protective layer 3 has insulative and heat-resistant properties it does not melt against the predetermined temperature nor experience deterioration.

Figure 1C:
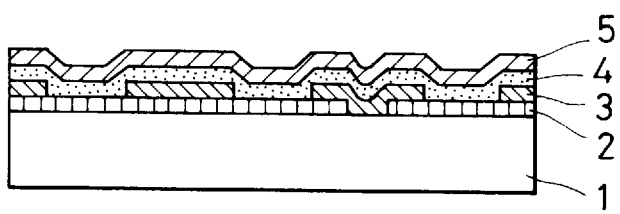

Next, as shown in FIG. 1C, an emitting functional layer 4 is uniformly formed on the anode 2 or the laser protective layer 3 by using the resistance-heating method in such a manner that a plurality of organic materials are layered as a multi-layer structure. After that, a cathode material 5 is uniformly formed on the emitting functional layer 4 at a predetermined thickness by using the vacuum vapor deposition.

Figure 1D:
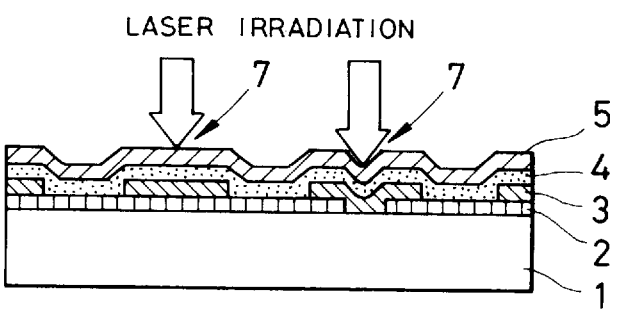
Figure 1E:
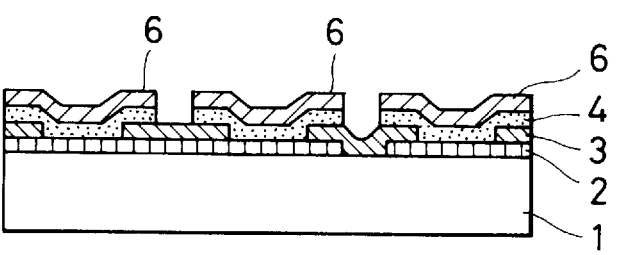

Next, as shown in FIG. 1D, the laser beams with a predetermined intensity are irradiated to the laser-material-processing portions 7, so that the emitting functional layer 4 and the cathode material 5 at the laser-material-processing portions 7 are evaporated and removed. As a result, as shown in FIG. 1E, the cathodes 6 are formed. Finally, an organic electroluminescent element having a plurality of pixels according to the pixel regions 8 is manufactured.

In the above laser-material-processing, the YAG laser (including a SHG element and a THG element), the excimer laser or the like is used as similarly used in the thin film processing. The laser beam is converged as a light spot with a diameter of tens—hundreds micrometers on the cathode material layer 5 and scanned so as to make a predetermined cathode pattern. Alternatively, after the mask of the predetermined pattern having apertures through which the laser beam can pass is disposed on the cathode material layer 5, it is exposed by using the laser beam with a large area such as a surface illuminant source. In addition, the intensity of laser light is set to a maximum in a range that prevents any damage to the laser protective layer 3 and the anode 2. In this first embodiment, Laser trimmer LT-150 (YAG laser ) which is available from HOYA Corporation is used at a 35–60% power of the greatest output thereof. As a result, a display panel of a 4×9 matrix type comprising organic electroluminescent elements having a 1 dot 2 square mm square with the cathode gap 100 micrometers has been obtained.

As mentioned above, since the laser protective layer 3 is formed so as to surround and cover the edge portions of the anode 2 to be processed by the laser beam in the laser-material-processing in the present embodiment, the anode 2 is protected by the laser protective layer 3 even though using a high power laser beam for the laser-material-processing without any thermal damage. Therefore, the range of a suitable intensity for the laser beam exposure can be expanded in the laser-material-processing, so that the cathode material 5 can be processed by the high power laser beam without any residual burr.

Next, the second embodiment according to the present invention will be described in more detail with reference to FIGS. 2A–2E and Table 1. FIGS. 2A–2E are partially enlarged schematic cross-sectional views of an organic electroluminescent element of the present invention in which members formed on a substrate are laser-processed in turn in the manufacture of the organic electroluminescent element.

Figure 2A:
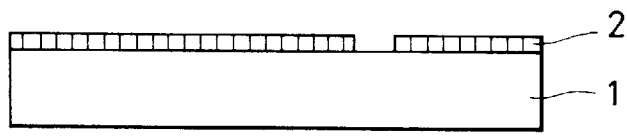
FIGS. 2A–2E are schematic cross-sectional views each showing a substrate of an organic electroluminescent element in the laser-processing of a second embodiment according to the present invention.

First, as shown in FIG. 2A, a transparent anode 2 is formed with a predetermined shape on a transparent glass substrate 1 as similarly shown in FIG. 1.

Figure 2B:
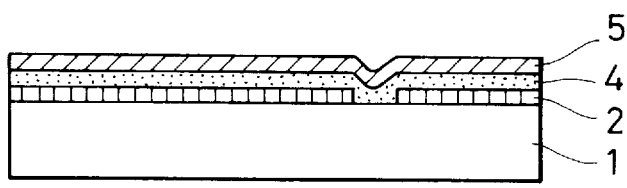

Next, as shown in FIG. 2B, an emitting functional layer 4 is uniformly formed on the glass substrate 1 or the anode 2 by using the resistance-heating method in such a manner that a plurality of organic materials are layered as a multi-layer structure. After that, a cathode material 5 is uniformly formed on the emitting functional layer 4 at a predetermined thickness by using the vacuum vapor deposition.

Figure 2C:
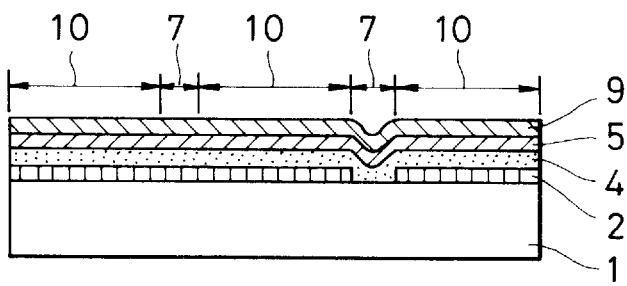

Next, as shown in FIG. 2C, a laser absorbing layer 9 is uniformly formed on the cathode material 5. The laser absorbing layer 9 is formed at a thickness of from tens angstroms to several micrometers so that its surface has a reflectance lower than that of the cathode material 5. In FIG. 2C, numerals 7 and 10 denote the laser-material-processing portions and the pixel regions respectively.

Figure 2D:
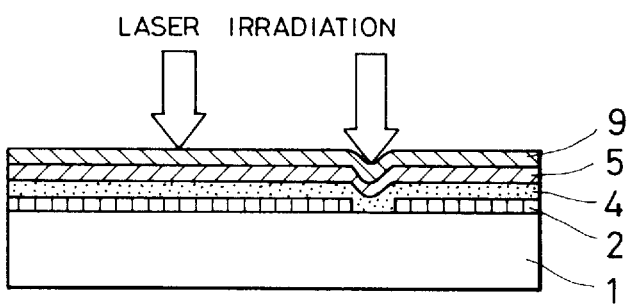
Figure 2E:
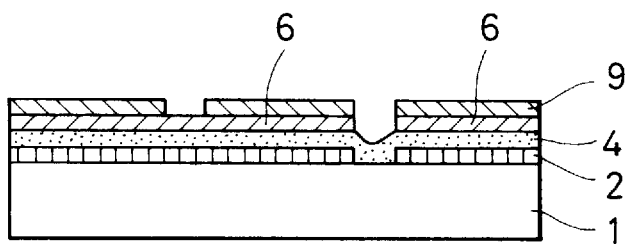

Next, as shown in FIG. 2D, the laser beams with a predetermined intensity are irradiated to the laser-material-processing portions 7, so that the laser absorbing layer 9 and the cathode material 5 at the laser-material-processing portions 7 are evaporated and removed. As a result, as shown in FIG. 2E, the cathodes 6 are formed. Finally, an organic electroluminescent element having a plurality of pixels according to the pixel regions 10 is manufactured.

In this second embodiment, since the laser absorbing layer 9 has a relatively low reflectance and absorbs the impinged laser beam at a high efficiency, the heat caused by the laser beam is absorbed by the laser-material-processing portion 7 at a high efficiency. Therefore, the anode 2 and the edge portions of the laser-material-processing portion 7 are protected by the laser absorbing layer 9 even though using a high power laser beam for the laser-material-processing without any thermal damage while the laser absorbing layer 9 and the cathode material 5 in the laser-material-processing portion 7 are removed without any residual burr of the cathode 6. Therefore, even if the laser beam impinged to the laser-material-processing portion of the laser absorbing layer 9 has the unevenness of intensity or a low intensity, the heat caused by the laser beam is suitably distributed via the laser absorbing layer 9 to the specific cathode material 5 for the laser-material-processing. In addition, the low limit of a suitable intensity to the laser beam exposure can be expanded in the laser-material-processing, so that the cathode material 5 can be processed by the high power laser beam without any residual burr.

In this second embodiment, while using a Laser trimmer LT-150 (YAG laser ) which is available from HOYA Corporation, various organic electroluminescent elements have manufactured. Data has been measured on the composite reflectances of the cathode material layer 5 made of Aluminum (Al) and the laser absorbing layer 9 made of Indium (In) and the suitable intensities of the impinged laser beam to the laser absorbing layer 9 with respect to the thickness of the laser absorbing layer 9 in the laser-material-processing. The result is shown in Table 1.

TABLE 1

| Thickness of laser absorbing layer (Angstroms) | Suitable laser (In) (%) | Reflectance intensity (%) |
|---|---|---|
| 0 | 30–35 | 93.9 |
| 200 | 17–35 | 51.9 |
| 500 | 9–35 | 33.4 |
| 1000 | 10–35 | 32.1 |
| 1300 | 10–35 | 4.2 |
| 1600 | 12–35 | 27.2 |
| 2000 | non | 64.5 |

As seen from Table 1, when the laser absorbing layer 9 is not formed, the reflectance is a 93.9% as a high reflectance. Therefore, the suitable laser beam intensity is a 30–35% power of the greatest output of the laser. This range of beam intensity is narrow. However, when the laser absorbing layer 9 is formed, the reflectance is lowered. It is found that the low limit of the suitable intensity for the laser beam is expanded.

Next, the third embodiment according to the present invention will be described in more detail with reference to FIGS. 3A–3E. FIGS. 3A–3E are partially enlarged schematic cross-sectional views of an organic electroluminescent element of the present invention in which members formed on a substrate are laser-processed in turn in the manufacture of the organic electroluminescent element.

Figure 3A:
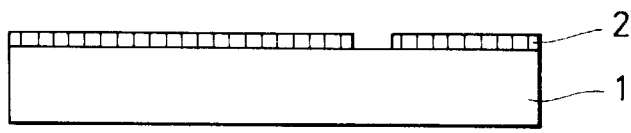
FIGS. 3A–3E are schematic cross-sectional views each showing a substrate of an organic electroluminescent element in the laser-processing of a third embodiment according to the present invention.
Figure 3B:
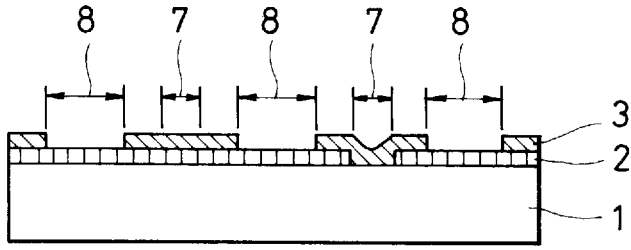

First, as shown in FIG. 3A, a transparent anode 2 is formed with a predetermined shape on a transparent glass substrate 1 as similarly shown in FIG. 1. Next, as shown in FIG. 3B, a photoresist layer is formed on the glass substrate 1 or the anode 2. After that, the resultant glass substrate is pre-baked. Next, portions in the pixel region 8 are exposed correspondingly to the pixels of the organic electroluminescent element and then the substrate 1 is developed and rinsed. After that, the resultant glass substrate is pot-baked. In this way, the laser protective layers 3 are formed on the glass substrate 1 or the anode 2 as similarly shown in FIGS. 1A–1E.

Figure 3C:
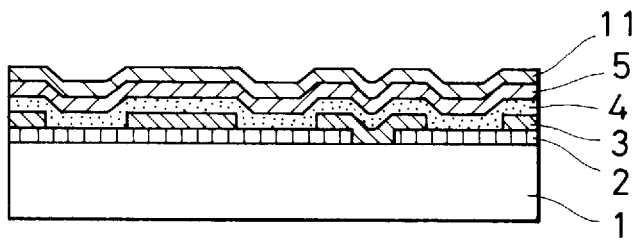

Next, as shown in FIG. 3C, an emitting functional layer 4 is uniformly formed on the anode 2 or the laser protective layer 3 by using the resistance-heating method in such a manner that a plurality of organic materials are layered as a multi-layer structure and then a cathode material 5 is uniformly formed on the emitting functional layer 4 at a predetermined thickness by using the vacuum vapor deposition. After that, the laser absorbing layer 11 is uniformly formed on cathode material layer 5.

Figure 3D:
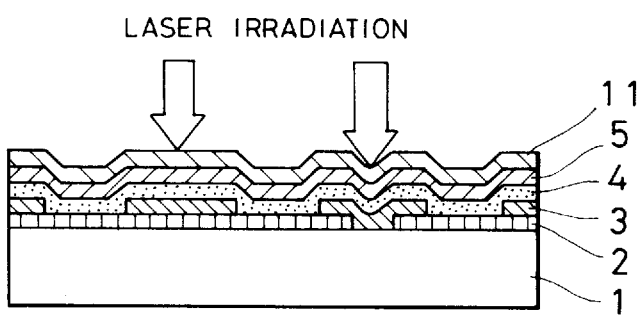
Figure 3E:
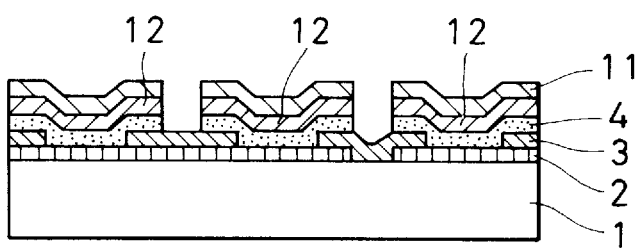
Figure 4:
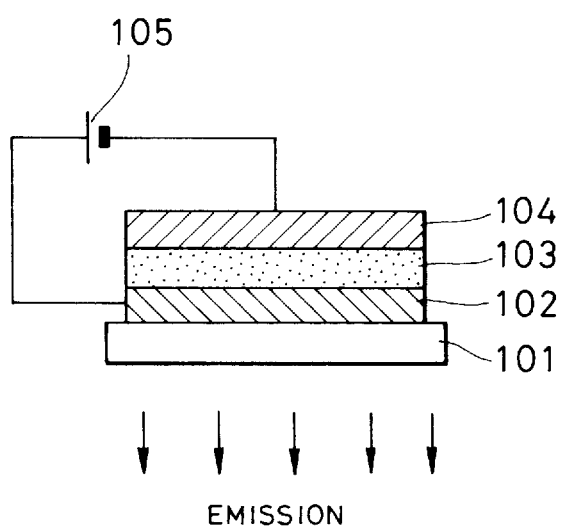
FIG. 4 is a schematic cross-sectional view showing a conventional organic electroluminescent element.
Figure 5A:
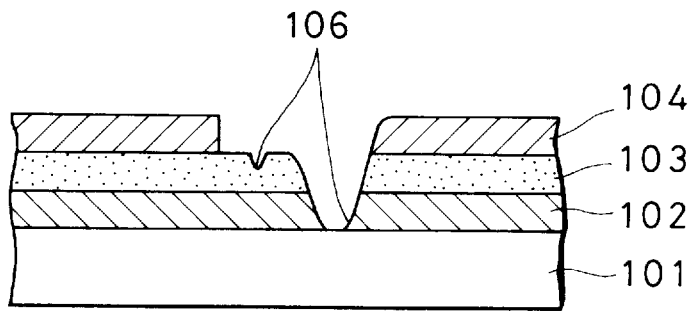
FIGS. 5A–5C are schematic cross-sectional views each showing a substrate of an organic electroluminescent element subjected to the conventional laser-material-processing of the cathode including various types of damage to the element.
Figure 5B:
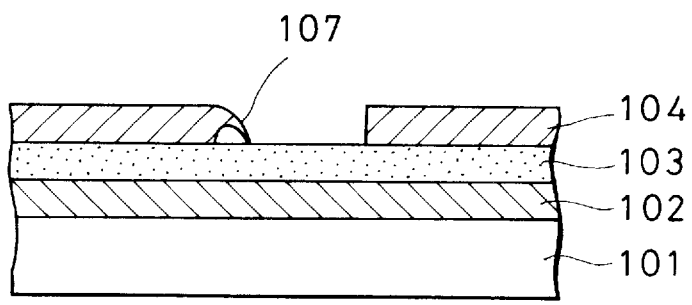
Figure 5C:
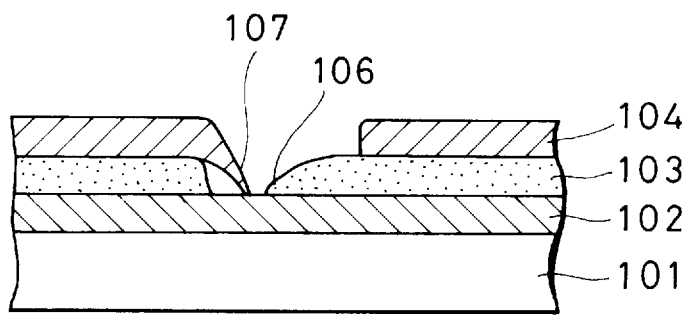

Next, as shown in FIG. 3D, the laser beams with a predetermined intensity are irradiated to the laser-material-processing portions 7, so that the laser absorbing layer 11 and the cathode material 5 at the laser-material-processing portions 7 are evaporated and removed. As a result, as shown in FIG. 3E, the cathodes 12 are formed. Finally, an organic electroluminescent element having a plurality of pixels according to the pixel regions 8 is manufactured.

In this third embodiment, while using a Laser trimmer LT-150 (YAG laser) which is available from HOYA Corporation an organic electroluminescent element has been manufactured. Data has been measured on the composite reflectances of the cathode material layer made of (Al) and the laser absorbing layer 11 made of (In) at a 1000 angstroms thickness and the suitable intensities of the impinged laser beam. As a result, the suitable laser beam intensity has been in a power range of from 10 to 65% of the greatest output of the laser. It is found that the low and high limits of the suitable intensity for the laser beam are expanded in the third embodiment in comparison with an intensity range of the conventional organic electroluminescent element (see the suitable laser intensity 30%–35% in Table 1 with a zero thickness of the laser protective layer). Therefore, according to the third embodiment, the heat caused by the laser beam is suitably distributed via the laser absorbing layer 11 to the specific cathode material for the laser-material-processing even if the laser beam impinged to the laser-material-processing portion of the laser absorbing layer has an uneven intensity or a low intensity. In addition, the low and high limits of a suitable intensity to the laser beam exposure can be expanded for protecting the edge portions to be processed from the thermal damage in the laser-material-processing, so that the cathode material can be easily processed by the high power laser beam without any residual burr.

In addition to the laser protective layer 3 of the photoresist with a thickness of 0.1–tens micrometers included in the embodiment according to the present invention above mentioned, such a laser protective layer may be formed of a metal or metallic compound or synthetic resin as far as having the heat-resistant property.

Furthermore, the laser protective layer may be entirely formed on the glass substrate or the anode except the pixels as far as having the insulative property. In this case, since the laser protective layer covers the edge portion of the anode pattern, electric shorting between the anode edge and the cathode is prevented advantageously when the organic electroluminescent element is driven.

Moreover, metal, metal oxides or organic compounds and the like may be usable for the material of the laser absorbing layer as far as such a material has a reflectance lower than the cathode material with respect to the wavelength of the laser beam and a good processed property. In this case, it is necessary to form the laser absorbing layer at a thickness sufficient to suppress the reflection of the cathode. The thickness of the laser absorbing layer is adjusted in the range of from tens angstroms to several micrometers in accordance with the necessary power of the laser beam for the processing, because an excessive thickness of the laser absorbing layer requires an excessive power of the laser beam. The thickness of the laser absorbing layer may be defined in a necessary minimum.

According to the present invention set forth in claim 1, the laser protective layer partially disposed between the emitting functional layer and the anode or the transparent substrate having a heat-resistant property prevents the thermal dispersion caused by the irradiated laser beam of the laser-material-processing, so that the portions to be provided with the laser-material-processing accumulate the heat energy at a high efficiency. Further, the laser protective layer interrupts the thermal dispersion under the portion to be provided with the laser-material-processing, so that no thermal damage occurs. Therefore, by using a high power laser beam a flexible cathode shape is easily processed without any damage to the element, so that the organic electroluminescent element is manufactured with a high yield rate of production.

According to the present invention set forth in claim 2, since the laser absorbing layer is formed of a thin film with a predetermined thickness having the reflectance lower than that of the cathode on at least a portion to be provided with the laser-material-processing on the cathode, the laser-processed portion can accumulate the heat energy caused by the irradiated laser beam at a high efficiency so that the laser absorbing layer enables a low power laser to process the cathode shape without any residual burr. In addition, the laser absorbing layer restricts the thermal dispersal around the portion to be provided with the laser-material-processing so as to protect the anode and the emitting functional layer from the thermal damage, so that the organic electroluminescent element is manufactured with a high yield rate of production.

It should thus be apparent that the scope of the teaching of this invention is not intended to be limited by only the embodiments that have been expressly disclosed and illustrated, but that instead the scope of the teaching of this invention should be read as being commensurate with the scope of the claims that follow.

What is claimed is:

1. An organic electroluminescent element comprising:

a transparent substrate;

an anode formed on said substrate;

an emitting functional layer made of an organic material formed on said anode;

a cathode disposed on said emitting functional layer with a predetermined shape formed by a laser-material-processing of said electroluminescent element; and a laser protective layer made of a heat-resistant thin film and disposed on at least a portion of said electroluminescent element provided with said laser-material-processing between said emitting functional layer and said anode.

2. An organic electroluminescent element comprising:

a transparent substrate;

an anode formed on said substrate;

an emitting functional layer made of an organic material formed on said anode;

a cathode disposed on said emitting functional layer with a predetermined shape formed by a laser-material-processing of said electroluminescent element; and a laser absorbing layer made of a thin film with a predetermined thickness having a reflectance lower than that of said cathode with respect to a predetermined wavelength of said laser beam and formed on said cathode at a portion of said electroluminescent element provided with said laser-material-processing.

3. An organic electroluminescent element comprising:

a transparent substrate;

an anode formed on said substrate;

an emitting functional layer made of an organic material formed on said anode;

a cathode disposed on said emitting functional layer with a predetermined shape formed by a laser-material-processing of said electroluminescent element;

a laser protective layer made of a heat-resistant thin film and disposed on at least a portion of said electroluminescent element provided with said laser-material-processing between said emitting functional layer and said anode; and a laser absorbing layer made of a thin film with a predetermined thickness having a reflectance lower than that of said cathode with respect to a predetermined wavelength of said laser beam and formed on said cathode at a portion of said electroluminescent element provided with said laser-material-processing.

4. A method of forming an organic electroluminescent element having a plurality of pixel regions separated by laser-material-processing portions, comprising steps of:

forming an anode layer of a predetermined shape on a transparent substrate layer;

forming a laser protective layer made of a heat-resistant thin film over said anode and substrate layers at least in the laser-material-processing portions;

forming an emitting functional layer made of an organic material over said laser protective, anode and substrate layers;

forming a cathode layer over said emitting functional, laser protective, anode and substrate layers; and forming cathodes of predetermined shapes in the pixel regions by irradiating at least said cathode layer with laser radiation in the laser-material-processing portions.

5. A method according to claim 4, wherein, in said irradiation step, said cathode and emitting functional layers are removed in the laser-material-processing portions by the laser radiation without removing said laser protective, anode and substrate layers.

6. A method according to claim 4, further comprising a step of, prior to said irradiation step, forming a laser absorbing layer made of a thin film having a reflectance lower than that of said cathode layer with respect to a predetermined laser radiation wavelength over said cathode layer at least in the laser-material-processing portions; and wherein said irradiation step comprises irradiating at least said laser absorbing and cathode layers with the laser radiation at the predetermined laser radiation wavelength.

7. A method of forming an organic electroluminescent element having a plurality of pixel regions separated by laser-material-processing portions, comprising steps of:

forming an anode layer of a predetermined shape on a transparent substrate layer;

forming an emitting functional layer made of an organic material over said anode and substrate layers;

forming a cathode layer over said emitting functional, anode and substrate layers;

forming a laser absorbing layer made of a thin film having a reflectance lower than that of said cathode layer with respect to a predetermined laser radiation wavelength over said cathode layer at least in the laser-material-processing portions; and forming cathodes of predetermined shapes in the pixel regions by irradiating at least said laser absorbing and cathode layers with laser radiation at the predetermined laser radiation wavelength in the laser-material-processing portions.

8. A method according to claim 7, wherein, in said step of forming cathodes, said laser absorbing and cathode layers are removed in the laser-material-processing portions by the laser radiation without removing said anode and substrate layers.

* * * * *